(12) United States Patent
Sudo et al.

(10) Patent No.: US 6,215,582 B1
(45) Date of Patent: Apr. 10, 2001

(54) LIGHT AMPLIFIER DEVICE

(75) Inventors: Satoshi Sudo, Sapporo; Takaharu Tomita, Kawasaki, both of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 08/810,672

(22) Filed: Mar. 3, 1997

(30) Foreign Application Priority Data

Sep. 9, 1996 (JP) .................................................... 8-238160

(51) Int. Cl.[7] .................................. H01S 3/00; G02B 6/00
(52) U.S. Cl. ............................. 359/341; 385/134; 385/135
(58) Field of Search ............................. 359/341; 385/134, 385/135

(56) References Cited

U.S. PATENT DOCUMENTS

| | | | | |
|---|---|---|---|---|
| 5,383,051 | * | 1/1995 | Delrosso et al. | 359/341 |
| 5,515,200 | * | 5/1996 | Delrosso et al. | 359/341 |
| 5,642,219 | * | 6/1997 | Ogiya et al. | 359/341 |
| 5,703,990 | * | 12/1997 | Robertson et al. | 385/135 |

\* cited by examiner

*Primary Examiner*—Mark Hellner
(74) *Attorney, Agent, or Firm*—Staas & Halsey

(57) ABSTRACT

A light amplifier device includes a module body to which an exciting light source, an optical multiplexer and an optical isolator are attached, and an optical fiber having a light amplifying function, the optical fiber being wound around the module body.

20 Claims, 22 Drawing Sheets

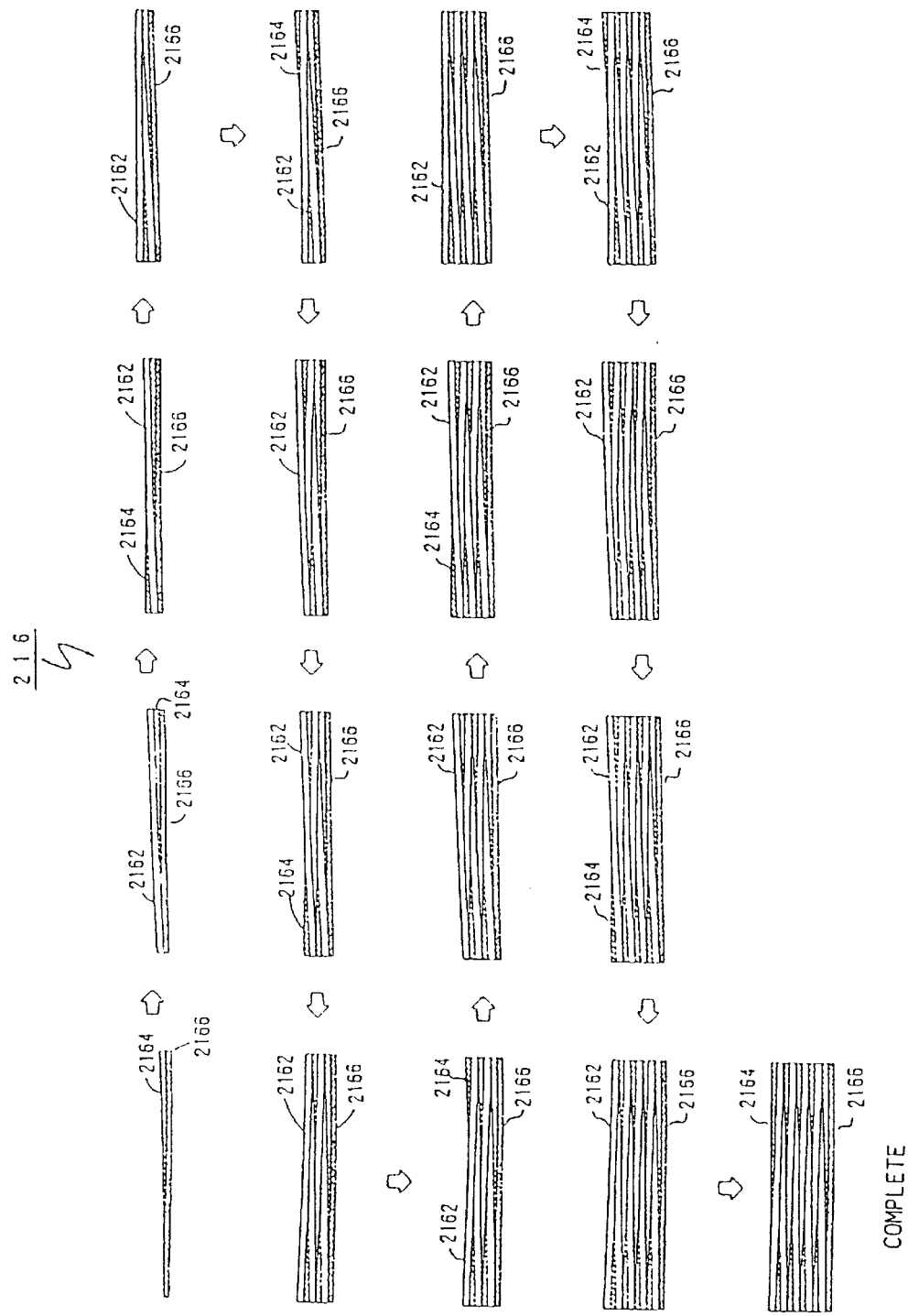

LIGHT AMPLIFIER DEVICE

BACKGROUND OF THE INVENTION

1. Field of the Invention

The present invention generally relates to light amplifier devices, and more particularly to a light amplifier device having an optical amplifier medium such as an optical fiber with a rare-earth element doped.

2. Description of the Related Art

FIG. 1 is a diagram of a conventional light amplifier device having an optical fiber with a rare-earth element doped. A light amplifier device 9 shown in FIG. 1 includes an optical fiber 5 with a rare-earth element doped. For example, the optical fiber 5 is an erbium-doped optical fiber. A signal light 9A is applied to the erbium-doped optical fiber via an optical isolator 1a and an optical multiplexer 2a, which is also called a wavelength-division multiplexing (WDM) coupler. An exciting light (pumping light) 9C is emitted from an exciting light source 3a, and is forwardly applied to the erbium-doped optical fiber via the optical multiplexer 2a. An exciting light source 3b emits another exciting light 9C, which is backwardly applied to the erbium-doped optical fiber 5 via an optical multiplexer 2b. The exciting lights 9C cause an inverted distribution of energy in the erbium-doped optical fiber 5. A control circuit 4 controls the output level and timing of the exciting lights 9C emitted from the exciting light sources 3a and 3b. The erbium-doped optical fiber 5 amplifies the signal light 9A due to induced emission. The amplified light signal passes through the optical multiplexer 2b and an optical isolator 1b.

Generally, the above structural components of the light amplifier device 9 are module components which stand alone therein. That is, in the device there are separately provided the erbium-doped optical fiber 5, the exciting light sources 3a and 3b, the optical multiplexers 2a and 2b and the optical isolators 1a and 1b. Hence, it is very difficult to realize down sizing of the light amplifier device 9. The modules are optically connected together by optical fibers, which are connected to the modules by a splice method (which is a thermal fusion method in which the optical fibers are heated). It will be noted that the connecting work is very troublesome. As the number of optical components of the light amplifier device 9 increases, the yield of the production decreases and the reliability degrades.

Further, there is another problem resulting from a requirement in which the radius of curvature of the optical fibers connecting the optical components together is equal to or greater than 30 mm. This requirement makes it difficult to arrange the optical fibers in the light amplifier device 9A (fiber homing) and prevents down sizing of the device 9A.

SUMMARY OF THE INVENTION

It is a general object of the present invention to provide a light amplifier device in which the above disadvantages are eliminated.

A more specific object of the present invention is to provide a down-sized, highly reliable, highly producible light amplifier device.

The above objects of the present invention are achieved by a light amplifier device comprising: a module body to which an exciting source, an optical multiplexer and an optical isolator are attached; and an optical fiber having a light amplifying function, the optical fiber being wound around the module body.

The light amplifier device may further comprise a photodiode for monitoring a light in the light amplifier device, the photodiode being attached to the module body.

The light amplifier device may further comprise a filter for allowing a light component having a given wavelength to pass therethrough, the filter being attached to the module body.

The light amplifier device may further comprise a control circuit having a circuit board which controls the exciting light source, the circuit board being attached to the module body.

The light amplifier device may further comprise a distribution compensating optical fiber via in which an incoming signal light to be amplified by the light amplifier device or an amplified signal light to be output from the light amplifier device is transferred, the distribution compensating optical fiber being wound around the module body.

The light amplifier device may be configured so that the module body has a cylindrically shaped portion around which the optical fiber having the light amplifying function is wound.

The light amplifier device may further comprise a board on which the exciting source, the optical multiplexer and the optical isolator are mounted, the board being accommodated in a hollow portion of the module body.

The light amplifier device may be configured so that: the module body has a cylindrically shaped portion around which the optical fiber having the light amplifying function is wound; and the light amplifier device further comprises a board on which the exciting source, the optical multiplexer and the optical isolator are mounted, the board being accommodated in a hollow portion of the module body.

The above-mentioned objects of the present invention are achieved by a light amplifier device comprising: a module body to which an exciting source, an optical multiplexer and an optical isolator are attached; and a silica-based optical waveguide member which has a light amplifying function and is mounted on the module body.

The light amplifier device may further comprise a photodiode for monitoring a light in the light amplifier device, the photodiode being attached to the module body.

The light amplifier device may further comprise a filter for allowing a light component having a given wavelength to pass therethrough, the filter being attached to the module body.

The light amplifier device may further comprise a control circuit having a circuit board which controls the exciting light source, the circuit board being attached to the module body.

The light amplifier device may further comprise a distribution compensating optical fiber via which an incoming signal light to be amplified by the light amplifier device or an amplified signal light to be output from the light amplifier device is transferred, the distribution compensating optical fiber being wound around the module body.

The light amplifier device may be configured so that the silica-based optical waveguide member has an optical path which has the light amplifying function and has a spiral formation.

The above-mentioned objects of the present invention are also achieved by a light amplifier device comprising: a module body; a silica-based optical waveguide member which has a light amplifying function and an optical multiplexer and is mounted on the module body; and an optical isolator and an exciting light source directly attached to the silica-based optical waveguide member.

The light amplifier device may further comprise a photodiode for monitoring a light in the light amplifier device, the photodiode being attached to the silica-based optical waveguide member.

The light amplifier device may further comprise a filter for allowing a light component having a given wavelength to pass therethrough, the filter being attached to the silica-based optical waveguide member.

The light amplifier device may further comprise a control circuit having a circuit board to control controlling the exciting light source, the circuit board being attached to the silica-based optical waveguide member.

The light amplifier device may further comprise a distribution compensating optical fiber via which an incoming signal light to be amplified by the light amplifier device or an amplified signal light to be output from the light amplifier device is transferred, said distribution compensating optical fiber being wound around the module body.

The light amplifier device may be configured so that the silica-based optical waveguide member has an optical path which has the light amplifying function and has a spiral formation.

BRIEF DESCRIPTION OF THE DRAWINGS

Other objects, features and advantages of the present invention will become more apparent from the following detailed description when read in conjunction with the accompanying drawings, in which:

FIG. 18 is a cross-sectional view showing steps of a method of producing the silica-based optical waveguide member;

DETAILED DESCRIPTION

Figure 1:
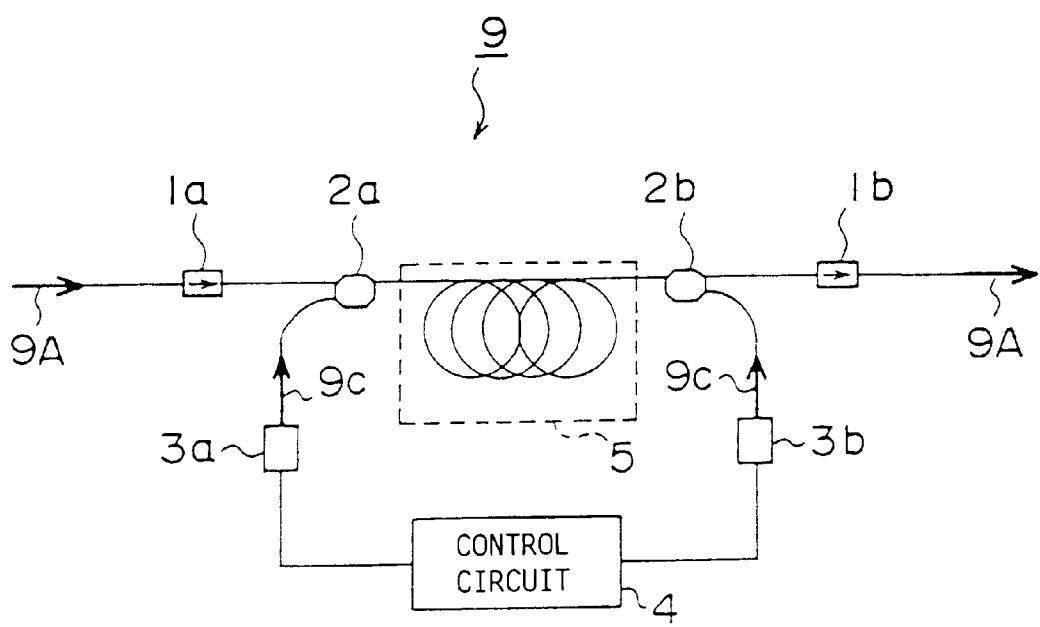
FIG. 1 is a diagram of a conventional light amplifier device.
Figure 2A:
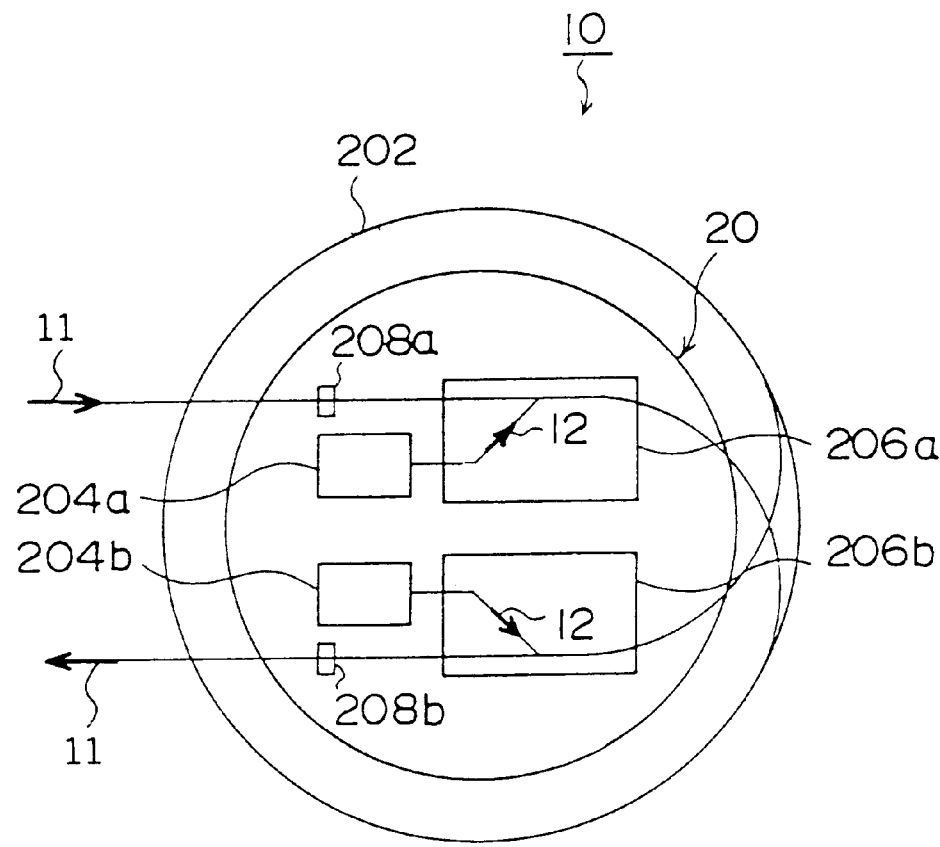
FIG. 2A is a top view of a light amplifier device according to a first embodiment of the present invention.
Figure 2B:
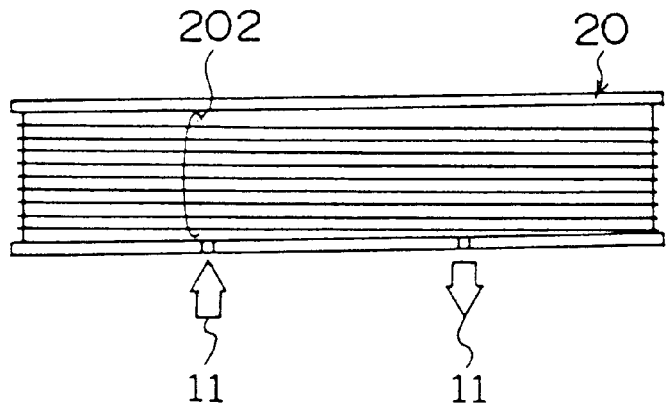
FIG. 2B is a side view of the light amplifier device shown in FIG. 2A.

FIGS. 2A and 2B are diagrams of a light amplifier device 10 according to a first embodiment of the present invention. The light amplifier device 10 includes an optical fiber 202 doped with a rare-earth element (for example, erbium). The optical fiber 202 functions as an optical amplifying medium, and amplifies a signal light 11 transferred over an optical fiber in the incoming direction. The light amplifier device 10 has a module body 20, which supports exciting light sources 204a, 204b, optical multiplexers 206a and 206b, and optical isolators 208a, 208b. The signal light transferred in the incoming direction is applied to the erbium-doped optical fiber 202 via the optical isolator 204a and the optical multiplexer 206a. An exciting light 12 emitted from the exciting light source 204a is forwardly applied to the erbium-doped optical fiber 202 via the optical multiplexer 206a. Another exciting light 12 emitted from the exciting light source 204b is backwardly applied to the erbium-doped optical fiber 202 via the optical multiplexer 206b. The amplified light signal obtained by the erbiumdoped optical fiber 202 passes through the optical multiplexer 206b and the optical isolator 208b, and is transferred over an optical fiber in the outgoing direction.

The optical isolators 208a and 208b allow the signal light to pass through only in the forward direction. For example, the optical isolator 208a prevents light from passing therethrough in the direction from the optical multiplexer 206a to the incoming optical fiber. Since the optical isolators 208a and 208b prevent unnecessary light components from being transferred, they prevent the erbium-doped optical fiber 202 from oscillating. It is possible to omit one of the optical isolators 208a and 208b, although the stability of the light amplifying operation may be degraded.

As shown in FIG. 2B, the erbium-doped optical fiber 202 is wound around the circumferential surface of the module body 20.

A further description of the light amplifier device 10 will be given with reference to FIGS. 3, 4 and 5. It will be noted that the light amplifier device 10 includes some components which are not shown in FIGS. 2A and 2B for the sake of simplicity.

Figure 3:
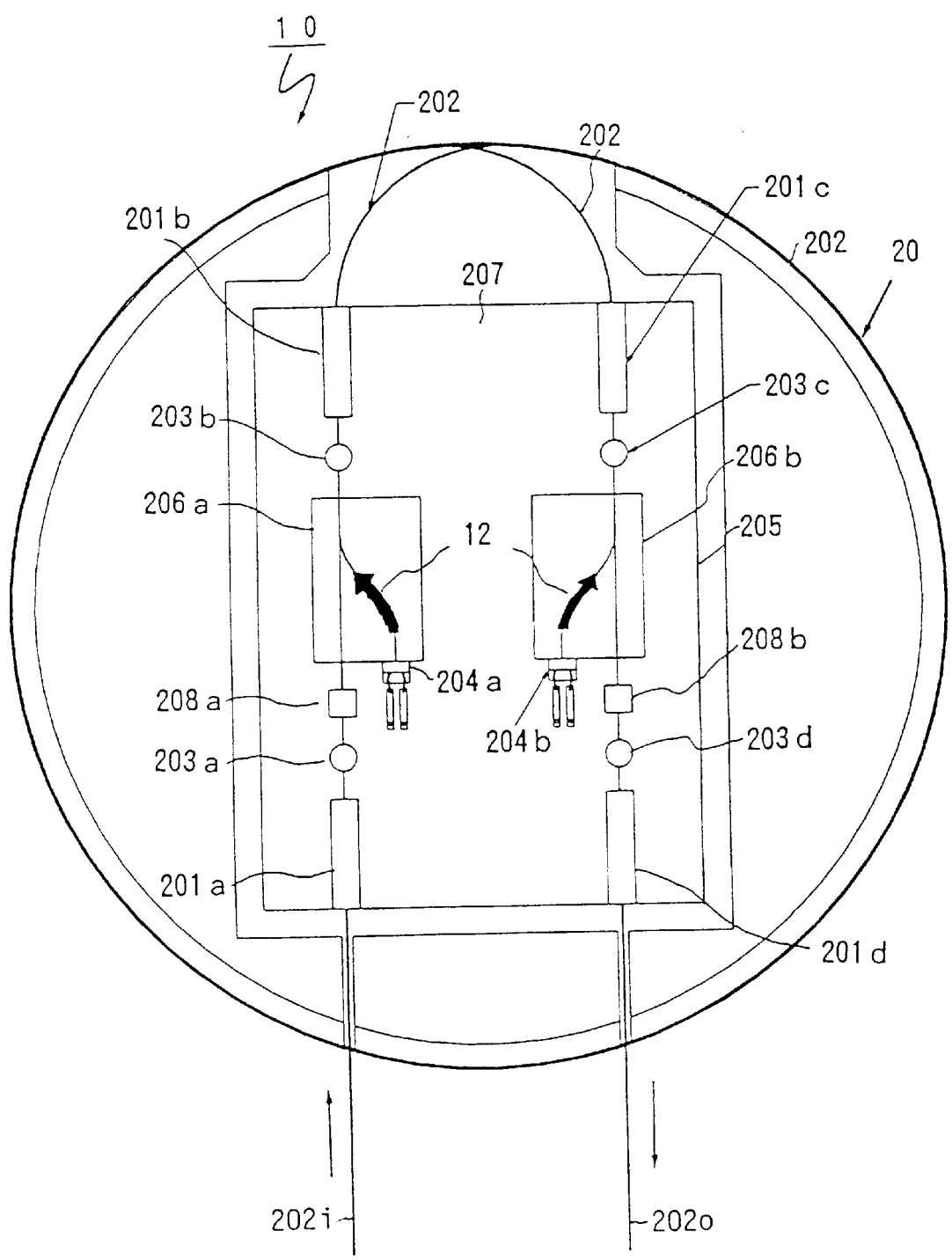
FIG. 3 is a top view of the light amplifier device shown in FIGS. 2A and 2B, in which the top view of the light amplifier device is illustrated in more detail.
Figure 4:
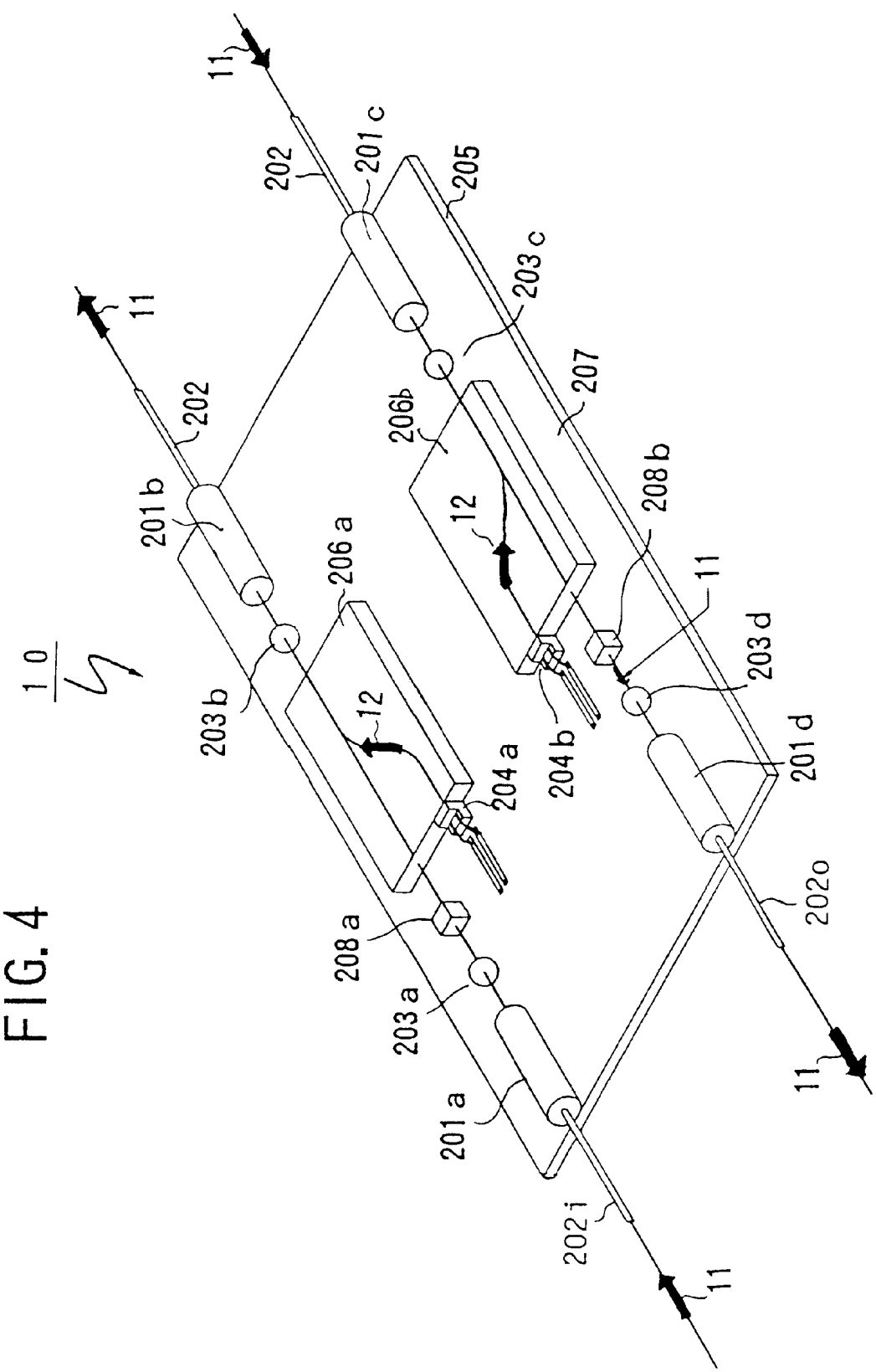
FIG. 4 is a perspective view of a board which is accommodated in a module body of the light amplifier device according to the first embodiment of the present invention.
Figure 5:
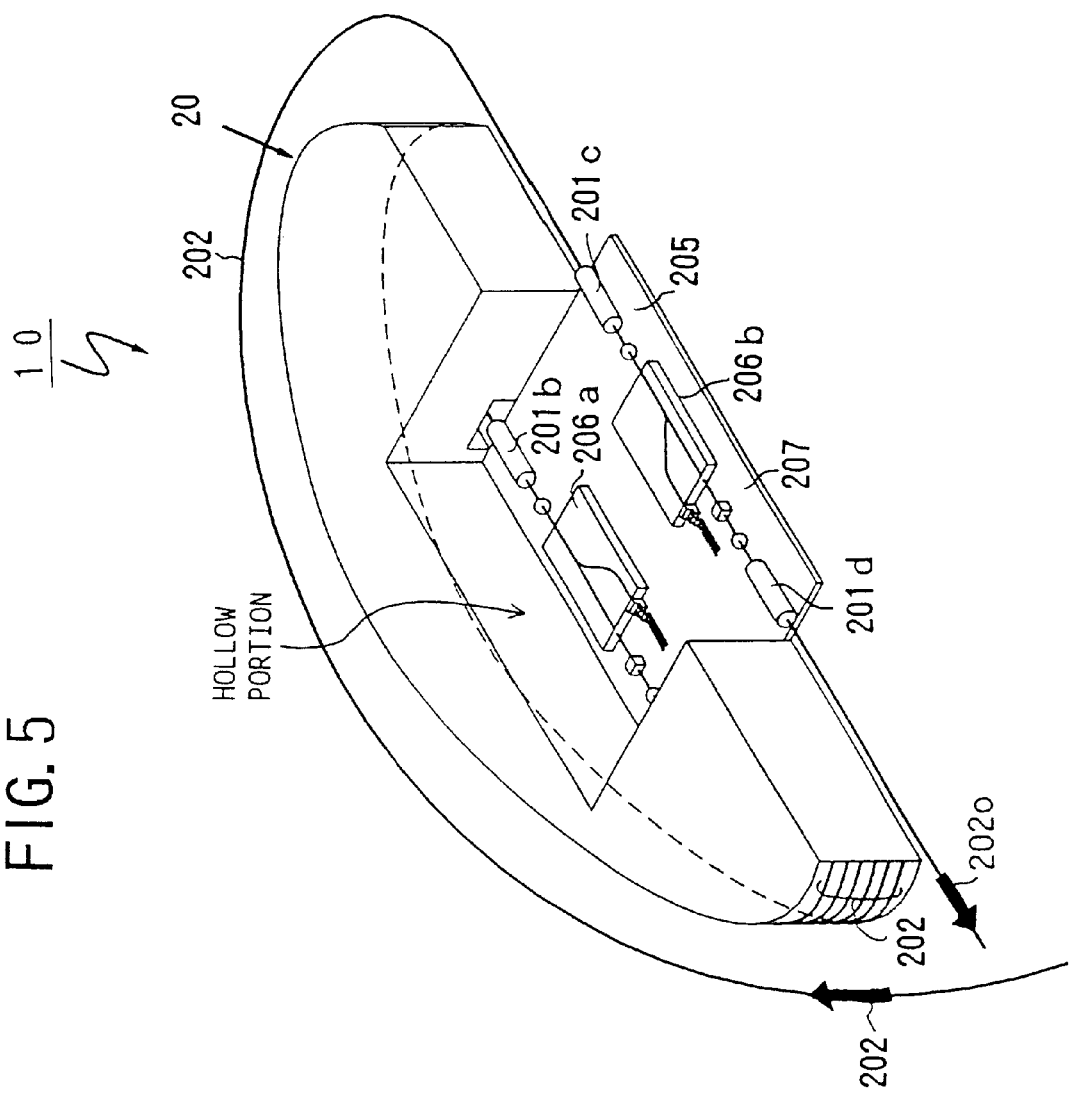
FIG. 5 is a partially cutoff perspective view of the light amplifier device according to the first embodiment of the present invention.

As shown in FIGS. 3, 4 and 5, a board 205 is accommodated in a hollow area formed in the module body 20. On a main surface 207 of the board 205, lenses 203a–203d, optical isolators 208a and 208b, optical multiplexers 206a and 206b, and exciting light sources 204a are provided and 204b. An optical fiber 202i in the incoming direction is fixed to the main surface 207 of the board 205 by means of a ferrule 201a. The lens 203a and the optical isolator 208a are arranged in line along the optical axis between the ferrule 201a and the optical multiplexer 206a. The exciting light source 204a is attached to a side surface of the optical multiplexer 206a. One end of the erbium-doped optical fiber 202 is fixed to the main surface 207 of the board 205 by means of a ferrule 201b.

The other end of the erbium-doped optical fiber 202 is fixed to the main surface 207 of the board 205 by means of a ferrule 201c. The lens 203c is provided between the ferrule 201c and the optical multiplexer 206b. The exciting light source 204b is attached to a side surface of the optical multiplexer 206b. The optical isolator 208b and the lens 203d are arranged in line between the optical multiplexer 206b and a ferrule 201d, which connects an optical fiber 202o in the outgoing direction to the main surface 207 of the board 205.

The erbium-doped optical fiber 202 is wound around the circumference surface of the module body 20, which has a cylindrical shape. There are holes connecting the hollow area of the module body 20 and the circumferential surface thereof. The erbium-doped optical fiber 202 passes through one of the through holes, as shown in FIG. 3. The optical fibers 202i and 202o pass through the other through holes, as shown in FIG. 3. The radius of the module body 20 has a value equal to or greater than the required value of the radius of curvature of the erbium-doped optical fiber 202. If the required value of the radius of curvature of the erbium-doped optical fiber 202 is equal to 30 mm, the radium of the cylindrically shaped module body 20 is set equal to or greater than 30 mm. It is easy to wind the erbium-doped optical fiber 202 around the circumferential surface of the module body 20 and to thus satisfy the requirement of the radius of curvature of the erbium-doped optical fiber 202. It should be noted that the optical components mounted on the board 205 are spatially coupled, and are not connected by optical fibers. Hence, it is possible to avoid the splice work and to easily assemble the light amplifier device 10 by a reduced number of production steps and enable down sizing and weight reduction. In practice, if the module body 20 has a height equal to 8 mm to 10 mm, all the optical components mounted on the board 205 can be accommodated therein. Hence, the light amplifier device 20 can be made compact.

The details of some optical components of the light amplifier device 10 will be described below.

The erbium-doped optical fiber 202 has a core doped with a small amount of erbium. Erbium efficiently absorbs the exciting light having a wavelength of 0.98 $\mu$m or 1.48 $\mu$m, so that an energy-inverted state can be caused. The signal light having a wavelength of 1.53 $\mu$m to 1.56 $\mu$m for the erbium-doped optical fiber can be amplified due to induced emission based on the energy-inverted distribution. The exciting light sources 204a and 204b are formed of semiconductor layer diodes capable of emitting the exciting lights 12 having a wavelength of 0.98 $\mu$m to 1.48 $\mu$m, taking into account the light absorbing wavelength of erbium (that is, 0.98 $\mu$m or 1.48 $\mu$m).

The module body 20 is formed of, for example, a metallic material such as aluminum.

Figure 6:
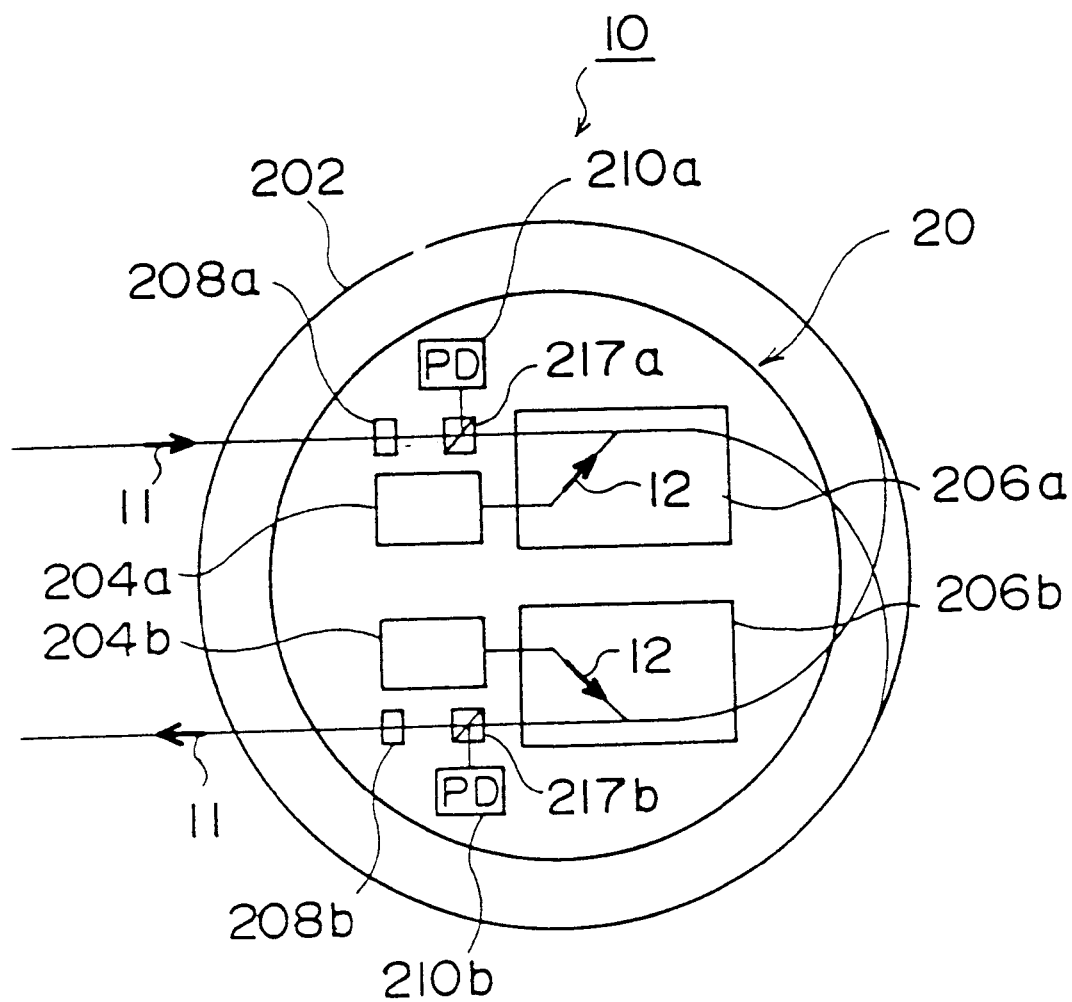
FIG. 6 is a top view of a light amplifier device according to a second embodiment of the present invention.

A description will now be given of a second embodiment of the present invention with reference to FIG. 6, in which parts that are the same as those shown in the previously described figures are given the same reference numbers. The light amplifier device 10 shown in FIG. 6 includes photodiodes (PD) 210a and 210b and beam splitters 217a and 217b in addition to the components used in the first embodiment of the present invention. The combination of the photodiode 210a and the beam splitter 217a is directed to monitoring the signal light after passing through the optical isolator 208a. The combination of the photodiode 210b and the beam splitter 217b is directed to monitoring the amplified signal light from the optical multiplexer 206b. The beam splitter 217a splits the signal light and directs a part thereof to the photodiode 210a, which produces a corresponding electric signal. The beam splitter 217b splits the amplified signal light and directs a part thereof to the photodiode 210b, which produces a corresponding electric signal.

The photodiodes 210a and 210b and the beam splitters 217a and 217b are mounted on the board 205, and thus there is no need to increase the size of the module body 20.

Figure 7:
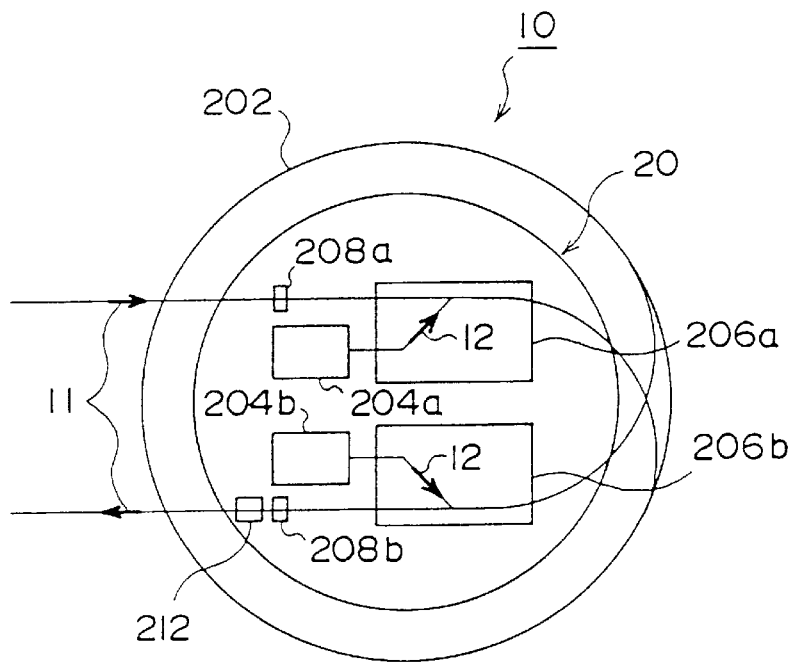
FIG. 7 is a top view of a light amplifier device according to a third embodiment of the present invention.

FIG. 7 shows a third embodiment of the present invention, in which parts that are the same as those shown in the previously described figures are the same reference numbers. The light amplifier device 10 shown in FIG. 7 is configured so that a narrow-band-pass filter 212 is added to the first embodiment of the present invention. The narrow-band-pass filter is provided at the light output side of the optical isolator 208b, and functions to allow only the signal light having the given wavelength to pass therethrough. Hence, it is possible to prevent unnecessary light components from being output to the outgoing optical fiber.

The narrow-band-pass filter 212 is mounted on the board 205, so that there is no need to increase the size of the module body 20 in order to accommodate the narrow-band-pass filter 212.

Figure 8:
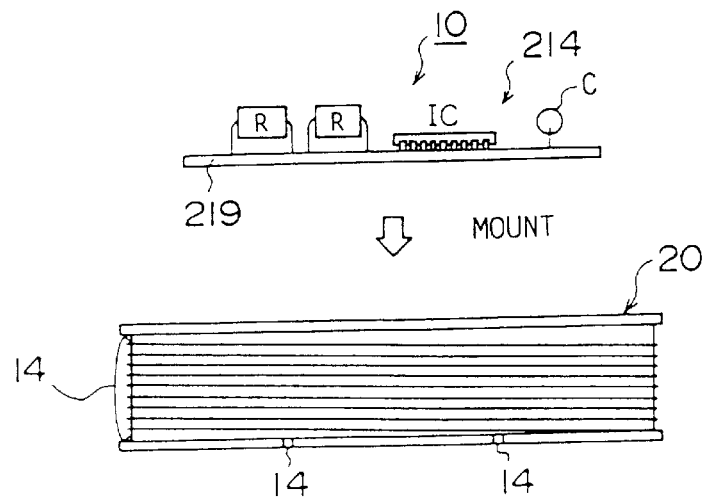
FIG. 8 is an exploded side view of a light amplifier device according to a fourth embodiment of the present invention.
Figure 9:
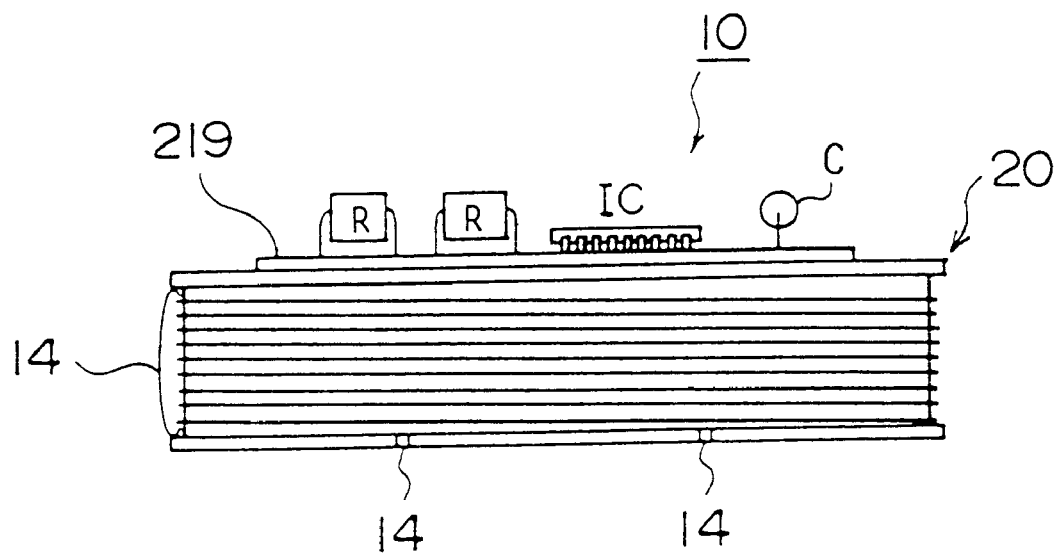
FIG. 9 is a side view of the light amplifier device according to the fourth embodiment of the present invention.

FIGS. 8 and 9 show a fourth embodiment of the present invention, in which parts the are the same as those shown in the previously described figures are given the same reference numbers. As has been described previously, the control circuit 214 controls the exciting light output timing and level of the exciting light sources 204a and 204b. In the first through third embodiments of the present invention, the control circuit 214 is provided outside of the light amplifier device 10 and is electrically connected to the exciting light sources 204a and 204b by means of, for example, wires (not shown for the sake of simplicity in the previously described figures).

The light amplifier device 10 shown in FIGS. 8 and 9 includes a circuit board 219 on which electronic components of the control circuit 214, such as ICs, resistors R and capacitors C, are mounted. The control circuit 214 thus configured is mounted on the top of the module body 20 and is fixed thereto by means of an adhesive, screws or another arbitrary fixing means. The control circuit 214 mounted on the top of the body 20 is electrically connected to the exciting light sources 204a and 204b by, for example, wires (not shown).

The light amplifier device 10 with the control circuit 214 integrated is almost the same size as in the first through third embodiments of the present invention, although the device 10 shown in FIGS. 8 and 9 has a slightly increased height. It is possible to provide the control circuit 214 inside of the module body 20 as it is partially or fully embedded therein.

Figure 10:
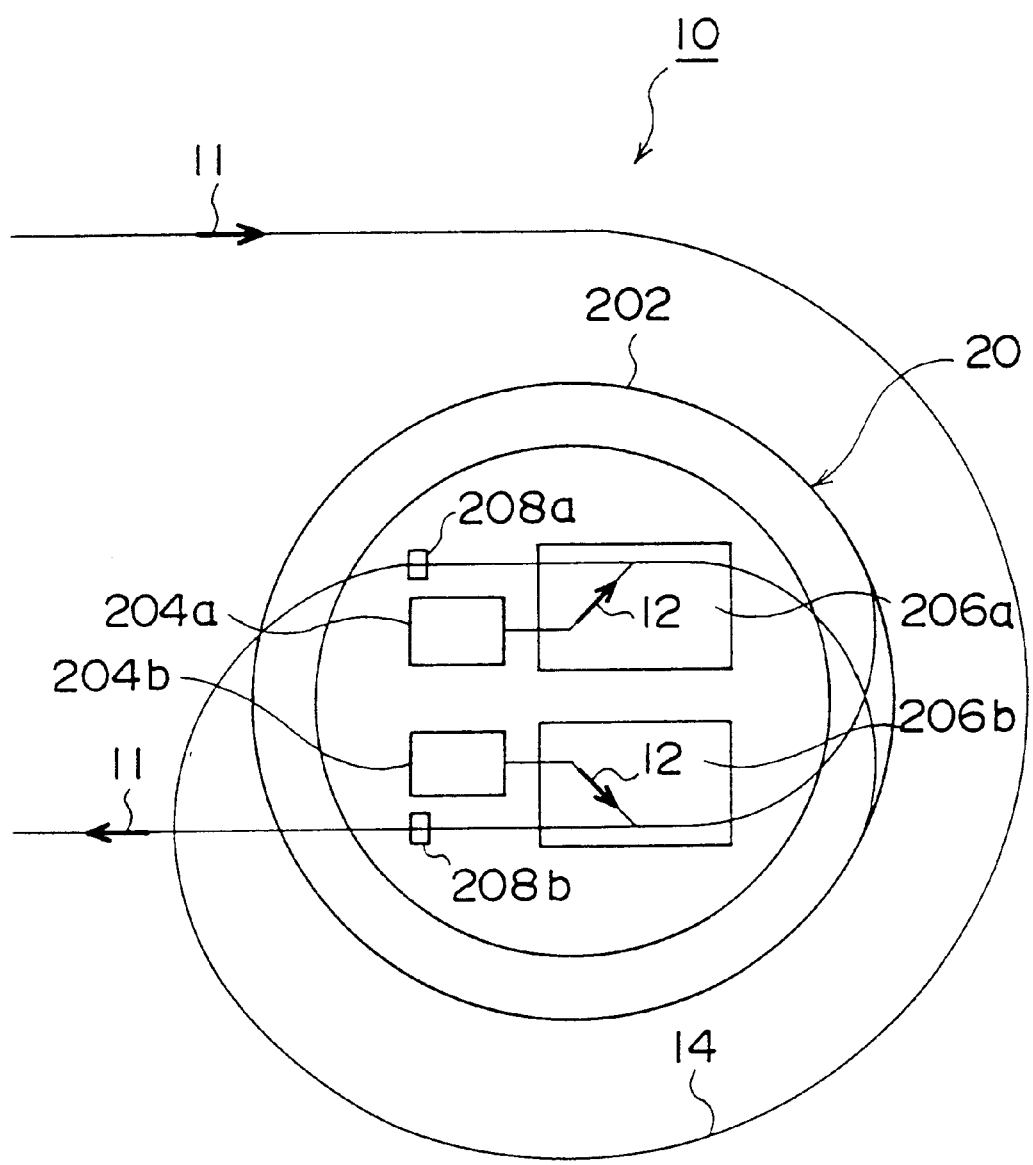
FIG. 10 is a top view of a light amplifier device according to a fifth embodiment of the present invention.

FIG. 10 shows a fifth embodiment of the present invention, in which parts that are the same as those shown in the previously described figures are given the same reference numbers. The light amplifier device 10 shown in FIG. 10 employs a distribution compensating type optical fiber 14 as the incoming optical fiber 202i. The signal light is transferred via the distribution compensating type optical fiber 14 and is applied to the light amplifier device 10. The distribution compensating type optical fiber 14 can be wound around the circumferential surface of the module body 20. It is also possible to employ another distribution compensating type optical fiber as the outgoing optical fiber 202o. In this case, the distribution compensating type optical fiber can be wound around the circumferential surface of the module body 20.

As described above, even if the distribution compensating type optical fibers are used as parts of the light amplifier device 10, the size thereof is not increased.

Figure 11:
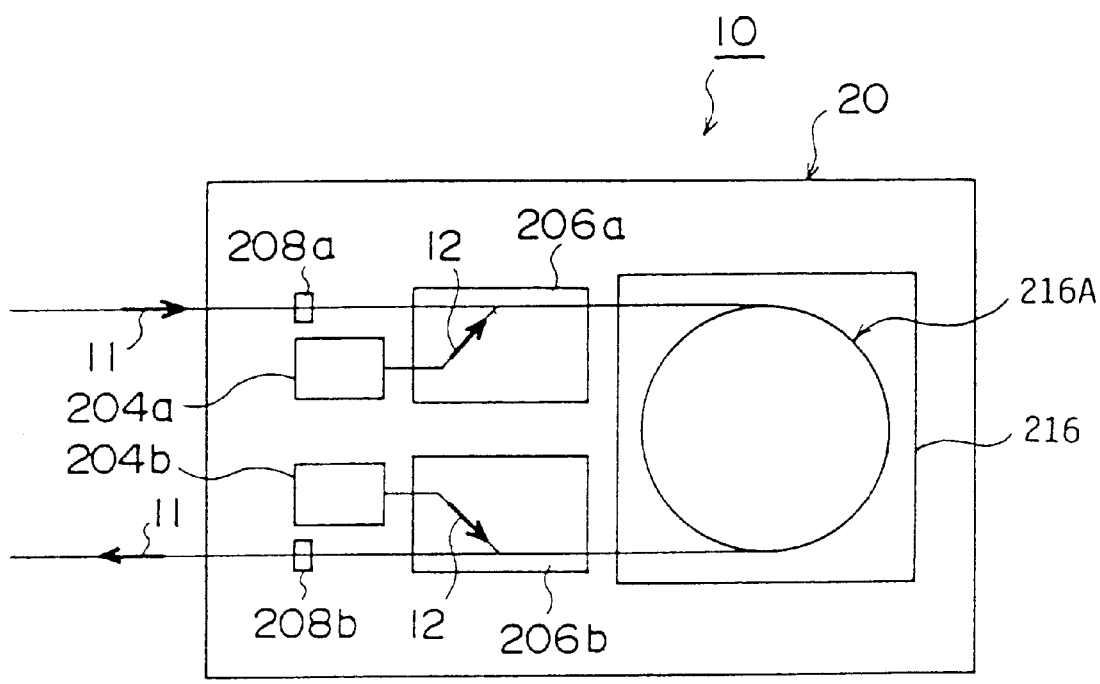
FIG. 11 is a top view of a light amplifier device according to a sixth embodiment of the present invention.
Figure 12:
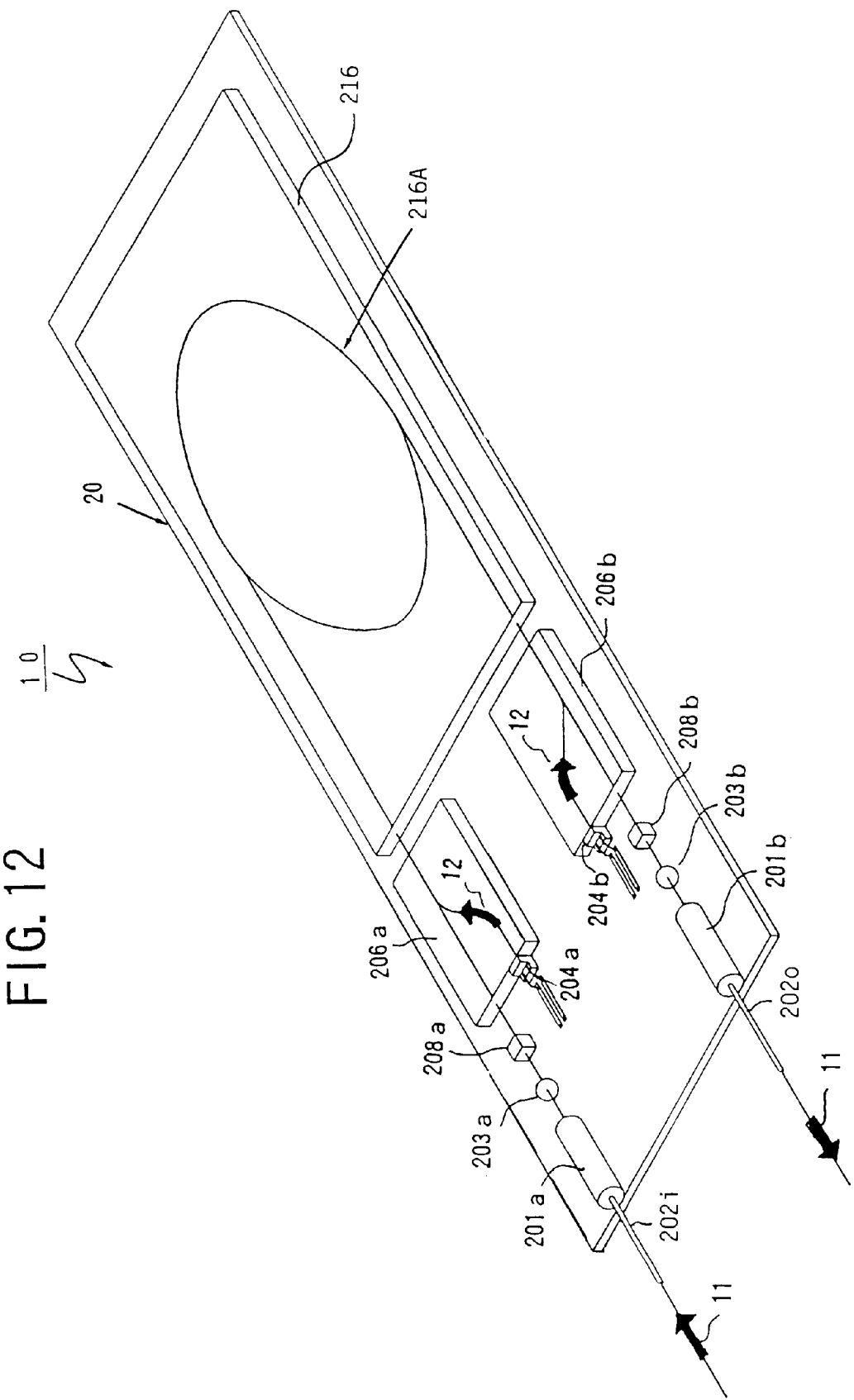
FIG. 12 is a perspective view of the light amplifier device according to the sixth embodiment of the present invention.

FIGS. 11 and 12 show a sixth embodiment of the present invention, in which parts that are the same as those shown in the previously described figures are given the same reference numbers. The light amplifier device 10 shown in FIG. 11 employs a silica-based waveguide member 216 doped with a rare-earth element (for example, erbium) in place of the erbium-doped optical fiber 202. The silica-based waveguide member 216 has an optical path 216A having a light amplifying function. As will be described later, the optical path 216A has a spiral formation. The silica-based waveguide member 216 includes a silicon substrate, a lower clad layer formed on the silicon substrate comprised of $SiO_2$ fine particles, a core layer formed on the lower clad layer comprised of $SiO_2$-$GeO_2$ fine particles and erbium, and an upper clad layer formed on the core layer comprised of $SiO_2$ fine particles. The module body 20 shown in FIGS. 11 and 12 has a plate shape rather than the cylindrical shape used in the first to fifth embodiments of the present invention. The optical components shown in FIG. 11 are mounted on the plate-shaped module body 20.

The use of the silica-based waveguide member 216 simplifies the shape of the module body 20 because it does not need the cylindrical shape on which the erbium-doped optical fiber 202 is wound. This increases the degree of freedom in design of the module body 20.

Figure 13:
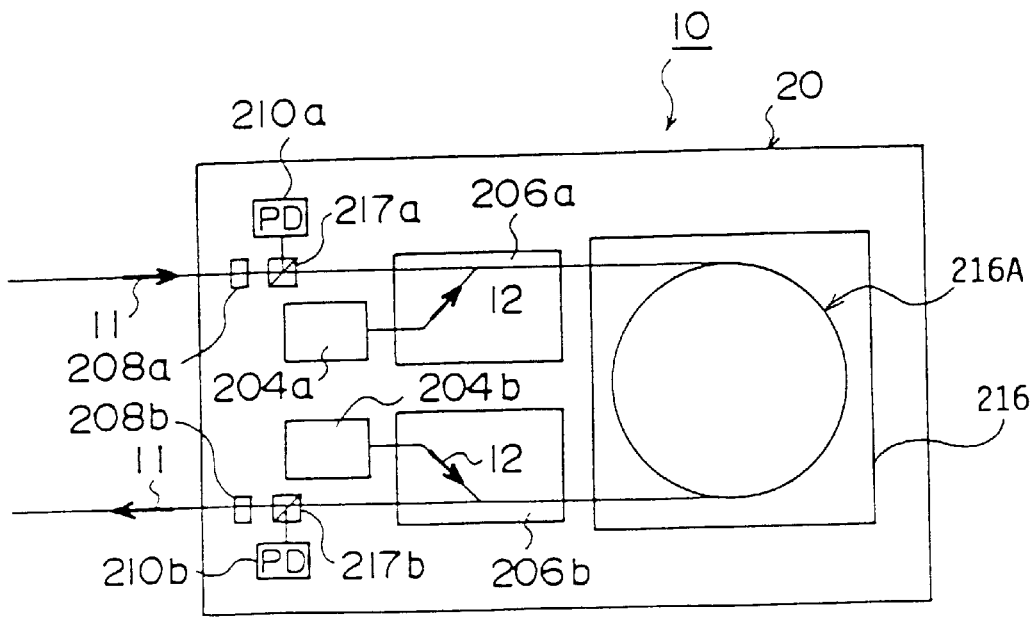
FIG. 13 is a top view of a light amplifier device according to a seventh embodiment of the present invention.

FIG. 13 shows a seventh embodiment of the present invention, in which parts that are the same as those shown in the previously described figures are given the same reference numbers. The light amplifier device 10 shown in FIG. 13 is based on the structure shown in FIGS. 11 and 12 and additionally includes some optical parts as shown in FIG. 6. More particularly, the light amplifier device shown in FIG. 6 includes the photodiodes 210a and 210b and the beam splitters 217a and 217b. Since these components are mounted on the plate-shaped module body 20, the components can be accommodated without any increase in the size of the module body 20.

Figure 14:
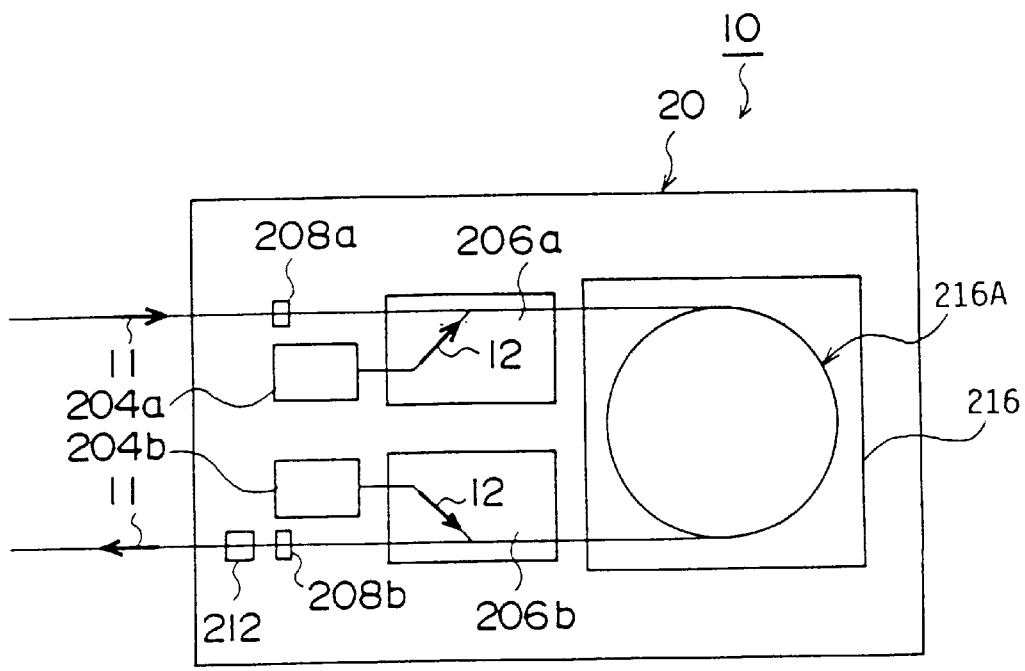
FIG. 14 is a top view of a light amplifier device according to an eighth embodiment of the present invention.

FIG. 14 shows an eighth embodiment of the present invention, in which parts that are the same as those shown in the previously described figures are given the same reference numbers. The light amplifier device 10 shown in FIG. 14 is based on the structure shown in FIGS. 11 and 12 and additionally includes the narrow-band-pass filter 212 shown in FIG. 7. As has been described previously, the narrow-band-pass filter 212 functions to allow only the signal light having the given wavelength to pass therethrough. Hence, it is possible to prevent unnecessary light components from being output to the outgoing optical fiber. Since the filter 212 is mounted on the plate-shaped module body 20, the components can be accommodated without any increase in the size of the module body 20.

Figure 15:
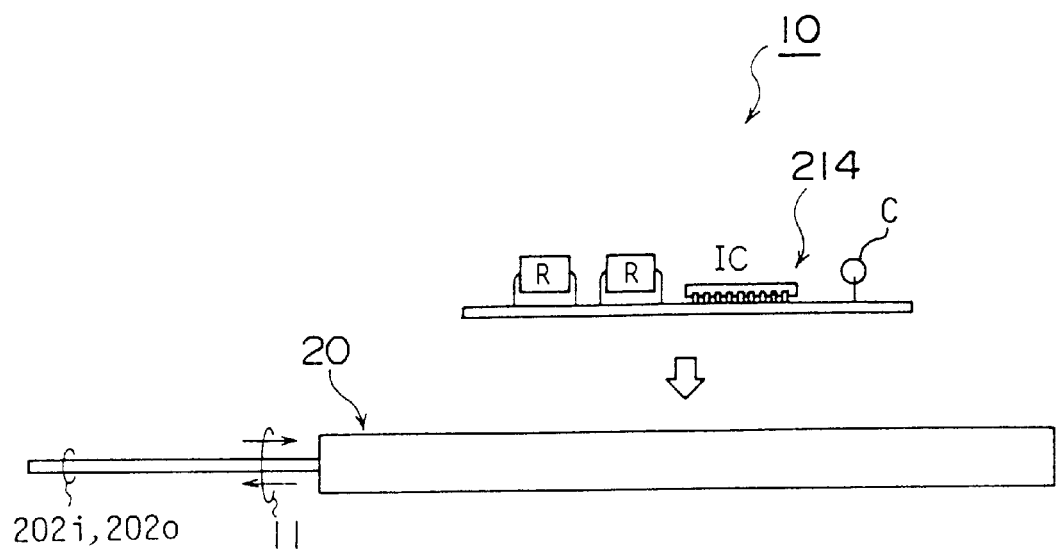
FIG. 15 is an exploded side view of a light amplifier device according to a ninth embodiment of the present invention.

FIG. 15 shows a ninth embodiment of the present invention, in which parts that are the same as those shown in the previously described figures are given the same reference numbers. The light amplifier device 10 shown in FIG. 15 is based on the structure shown in FIGS. 11 and 12, and additionally includes the control circuit 214, as has been described with reference to FIGS. 8 and 9. The light amplifier device 10 has the same advantages as those which have been described previously with reference to FIGS. 8 and 9.

Figure 16:
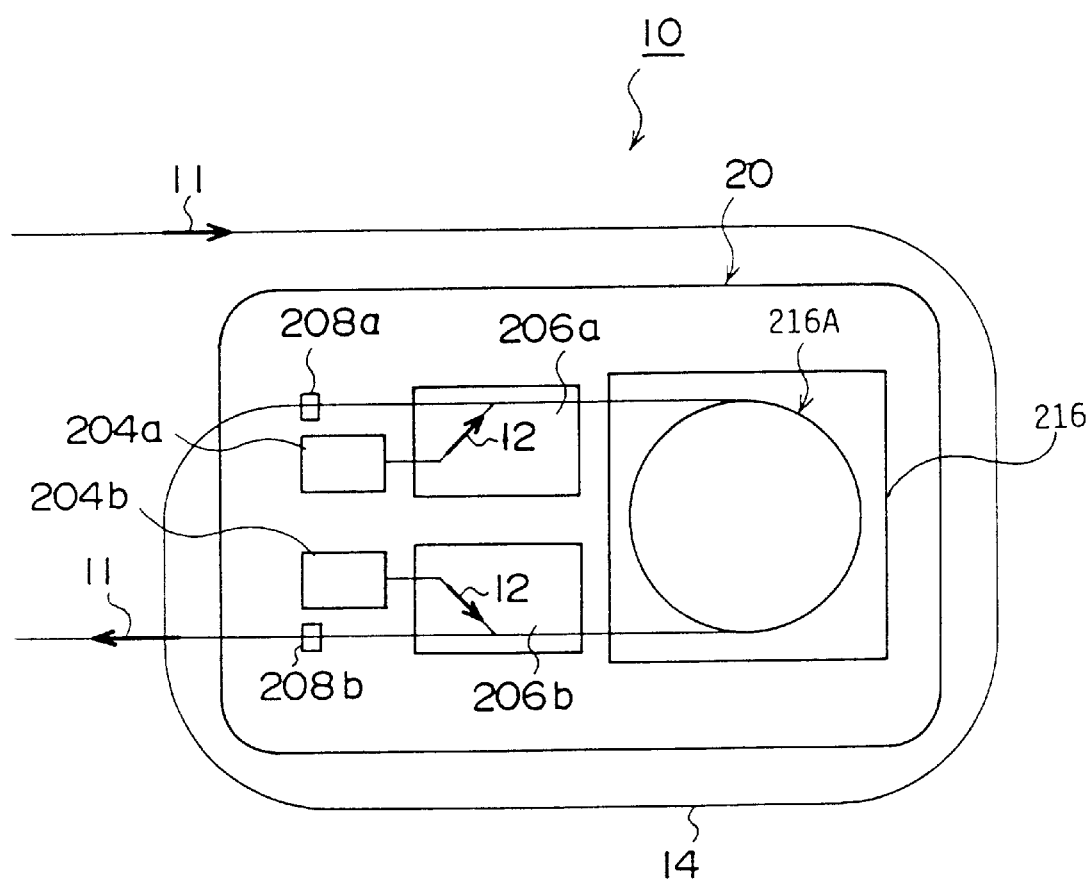
FIG. 16 is a top view of a light amplifier according to a tenth embodiment of the present invention.

FIG. 16 shows a tenth embodiment of the present invention, in which parts that are the same as those shown in the previously described figures are given the same reference numbers. The light amplifier device 10 shown in FIG. 16 has the distribution compensating type optical fiber 14 provided around the module body 20. The incoming signal light is applied to the optical isolator 208a via the distribution compensating optical fiber 14. It is also possible to use another distribution compensating optical fiber in order to output the amplified signal light.

An example of the silica-based waveguide member 216 doped with a rare-earth element (for example, erbium) will be described below, as an eleventh embodiment of the present invention.

Figure 17A:
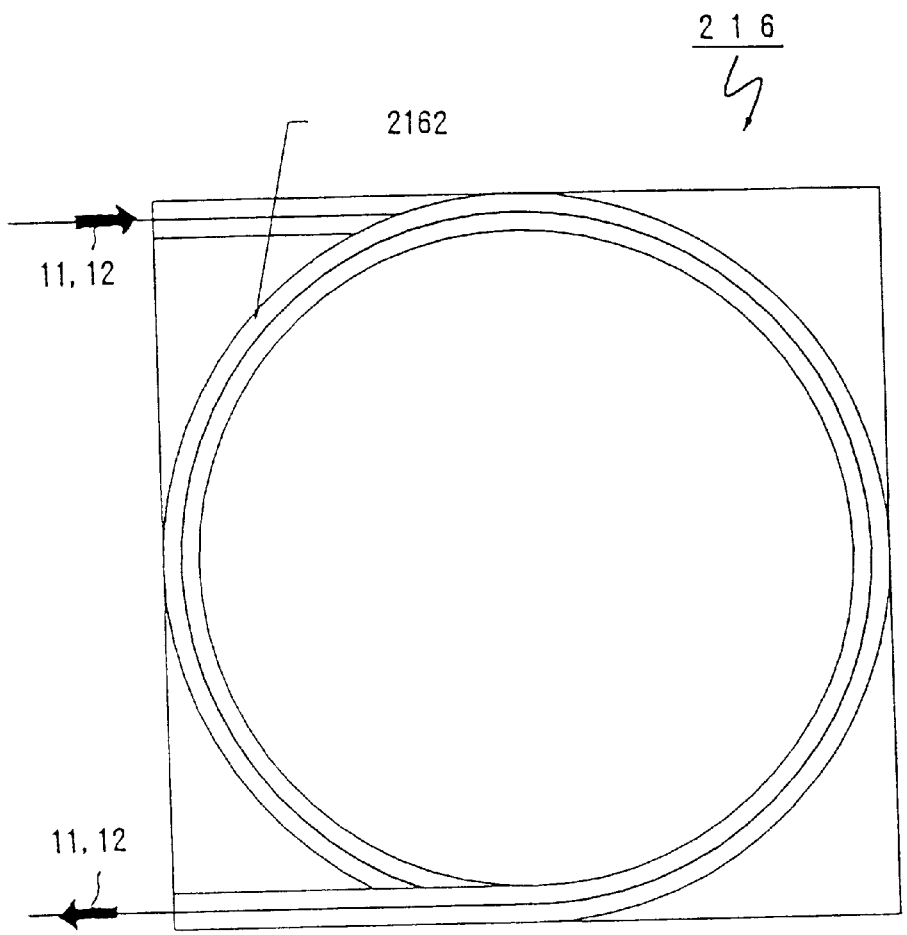
FIG. 17A is a top view of a silica-based optical waveguide member according to an eleventh embodiment of the present invention.
Figure 17B:
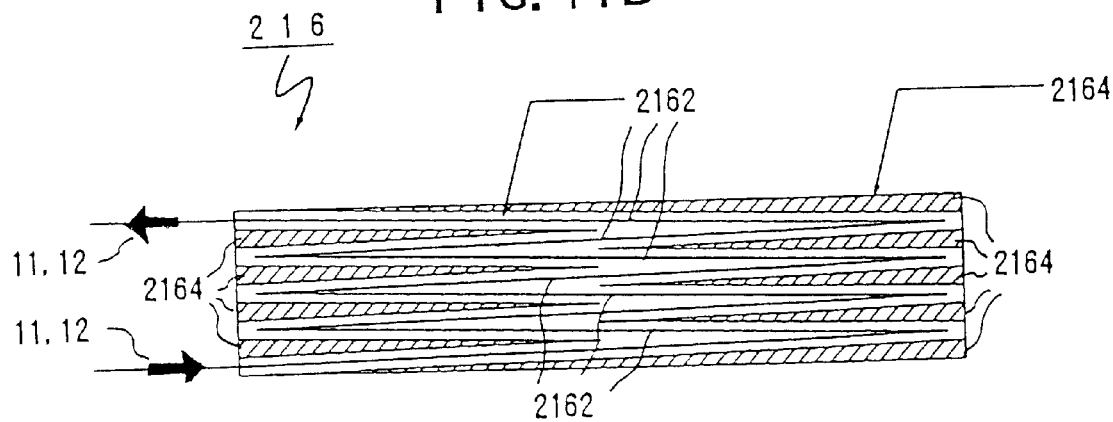
FIG. 17B is a cross-sectional view of the silica-based optical waveguide member shown in FIG. 17A.

FIGS. 17A and 17B are diagrams of the silica-based waveguide member 216 doped with a rare-earth element. The silica-based waveguide member 216 has the optical path 216A formed in a spiral formation. In the cross section of the waveguide member 216, a plurality of unit layers are stacked so as to form the spiral optical path 216A. Each of the unit layers includes a core layer 2162 sandwiched between clad layers 2164.

The silica-based waveguide member 216 having the optical path 216A can be produced as shown in FIGS. 18A through 18Q.

As shown in FIG. 18, the clad layer 2164 is deposited on a silicon substrate so that the surface of the clad layer 2164 has a slope at an angle of 5°. The above deposition step is carried out by, for example, a flame hydrolysis deposition method.

The core layer 2162 is formed on the clad layer 2164 and is doped with erbium. The clad layer 2164 is formed on the clad layer 2164 so that the surface of the core layer 2162 has a slope at an angle of 5°. The core layer 2162 is formed on the clad layer 2164 and is doped with erbium.

The above steps are repeatedly carried out as shown in FIG. 18.

The length of the optical path 216A of the silica-based waveguide member 216 can be easily adjusted by changing the number of stacked layers. If the silica-based waveguide member 216 has only a single layer, it may need a large size in order to obtain a sufficient length of the optical path 216A having the amplifying function.

Figure 19:
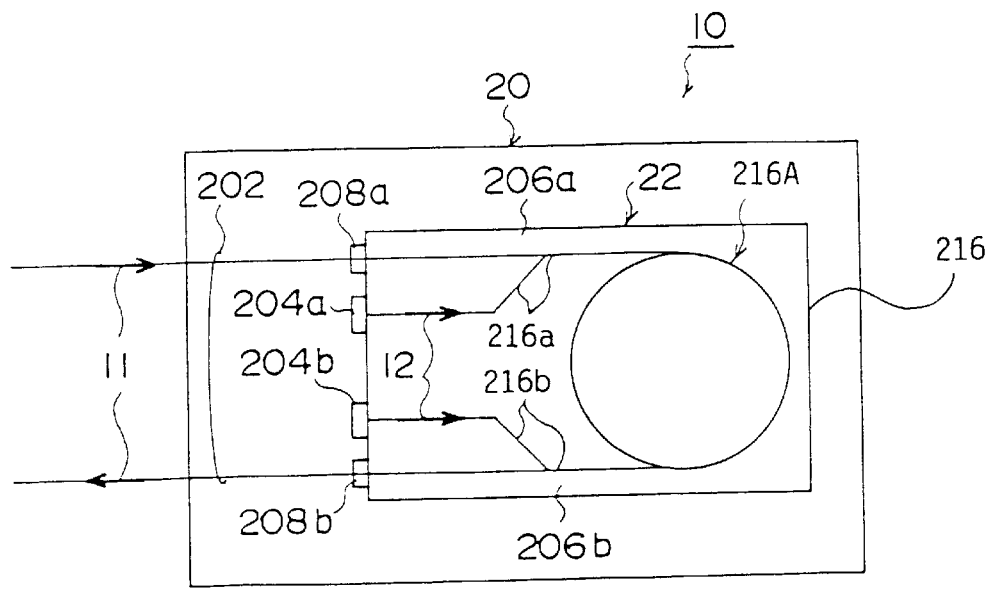
FIG. 19 is a top view of a light amplifier device according to a twelfth embodiment of the present invention.

FIG. 19 shows a twelfth embodiment of the present invention, in which parts that are the same as those shown in the previously described figures are given the same reference numbers. The light amplifier device 10 shown in FIG. 19 has the silica-based optical waveguide member 216 doped with a rare-earth element (for example erbium) so that the optical isolators 208a and 208b and the laser diodes 204a and 204b are directly attached to the silica-based optical waveguide member 216. More particularly, the optical isolators 208a and 208b are attached to a front surface of the silica-based optical waveguide member 216 so that the optical axes thereof respectively coincide with light incoming and outgoing portions of optical paths 216a and 216b formed in the silica-based optical waveguide member 216. The laser diodes 204a and 204b, which serve as the exciting light sources, are attached to the front surface of the silica-based optical waveguide member 216 so that the optical axes thereof respectively coincide with exciting light guiding path portions of the optical paths 216a and 216b formed in the silica-based optical waveguide member 216. The laser diodes 204a and 204b are, for example, surface light emitting type laser diodes in which laser beams are emitted in the direction perpendicular to a semiconductor substrate. The optical multiplexers 206a and 206b are embedded in the silica-based optical waveguide member 216.

It will be noted that the light amplifier device 10 shown in FIG. 19 thus configured is a one-chip device, and the signal light and the exciting lights pass through only the optical paths formed in the silica-based optical waveguide member 216 in the module. In other words, the lights substantially do not pass through air within the light amplifier device 10. Hence, it is possible to prevent the signal light and the exciting lights from being attenuated due to the fact that light is attenuated when it passes through air. Further, a small number of discrete optical components is used in the light amplifier device 10 shown in FIG. 19, as compared with the previously described embodiments of the present invention. Hence, a higher reliability and a higher yield can be obtained.

Figure 20:
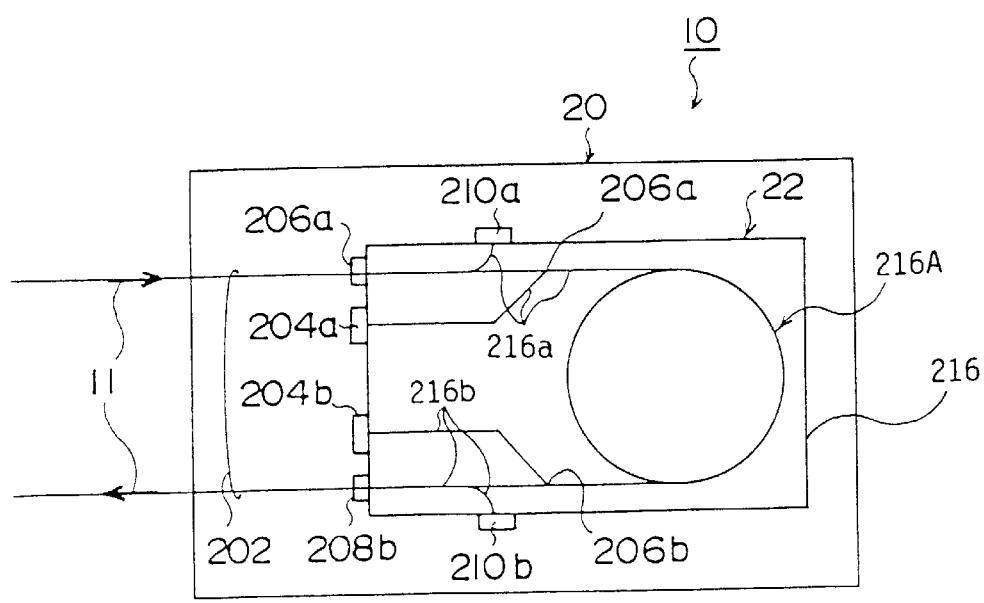
FIG. 20 is a top view of a light amplifier device according to a thirteenth embodiment of the present invention.

FIG. 20 shows a thirteenth embodiment of the present invention, in which parts that are the same as those shown in FIG. 19 are given the same reference numbers. The light amplifier device 10 shown in FIG. 20 is configured so that the photodetectors 210a and 210b are attached to side surfaces of the silica-based optical waveguide member 216. The optical paths 216a and 216b formed in the silica-based optical waveguide member 216 have portions respectively connected to the photodetector 210a and 210b. The light amplifier device shown in FIG. 20 has the same advantages as those of the device 10 shown in FIG. 19 and a further advantage that the incoming and outgoing light signals can be monitored.

Figure 21:
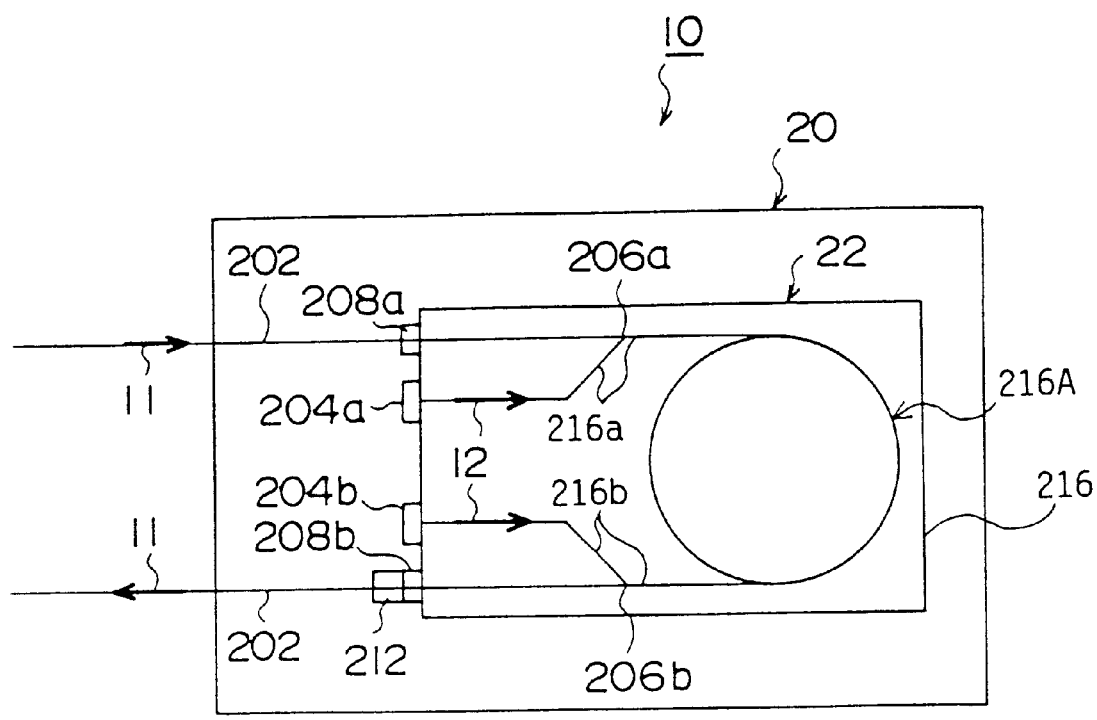
FIG. 21 is a top view of a light amplifier device according to a fourteenth embodiment of the present invention.

FIG. 21 shows a fourteenth embodiment of the present invention, in which parts that are the same as those shown in FIG. 19 are given the same reference numbers. The light amplifier device 10 shown in FIG. 21 has the narrow-band-pass filter 212 directly attached to the optical isolator 208b. The light amplifier device shown in FIG. 21 has the same advantages as those of the device 10 shown in FIG. 19 and a further advantage that unnecessary light components cannot be output.

Figure 22:
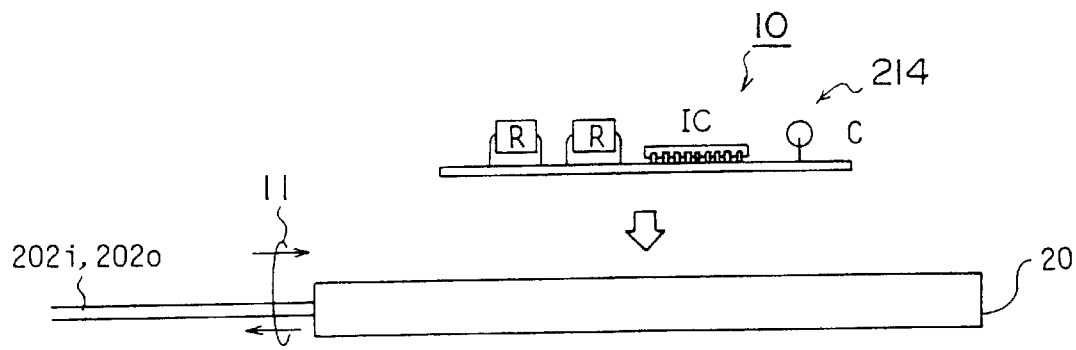
FIG. 22 is an exploded side view of a light amplifier device according to a fifteenth embodiment of the present invention.

FIG. 22 shows a fifteenth embodiment of the present invention, in which parts that are the same as those shown in FIG. 19 are given the same reference numbers. The light amplifier device 10 shown in FIG. 22 has the control circuit 214 directly mounted to the front or back surface of the module body 20. It is possible to provide the compact light amplifier device 10 equipped with the control circuit 214 in addition to the advantages of the device 10 shown in FIG. 19. When a case is further used to accommodate the module body 20, the control circuit 214 can be provided within the case or attached thereto.

Figure 23:
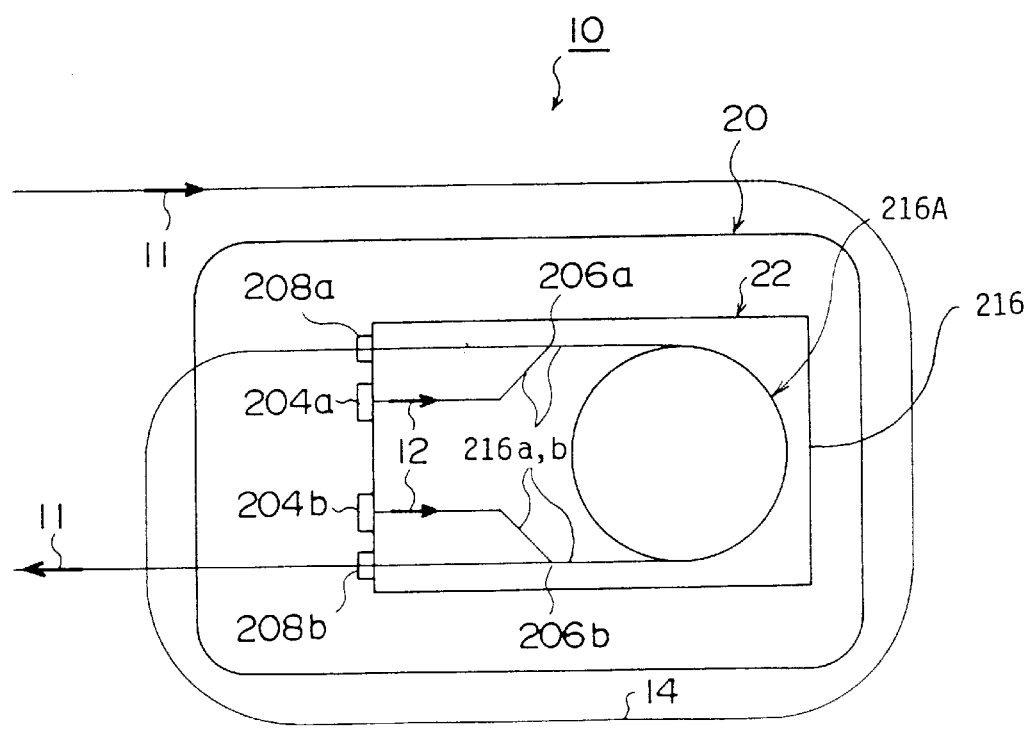
FIG. 23 is a top view of a light amplifier device according to a sixteenth embodiment of the present invention.
Figure 24:
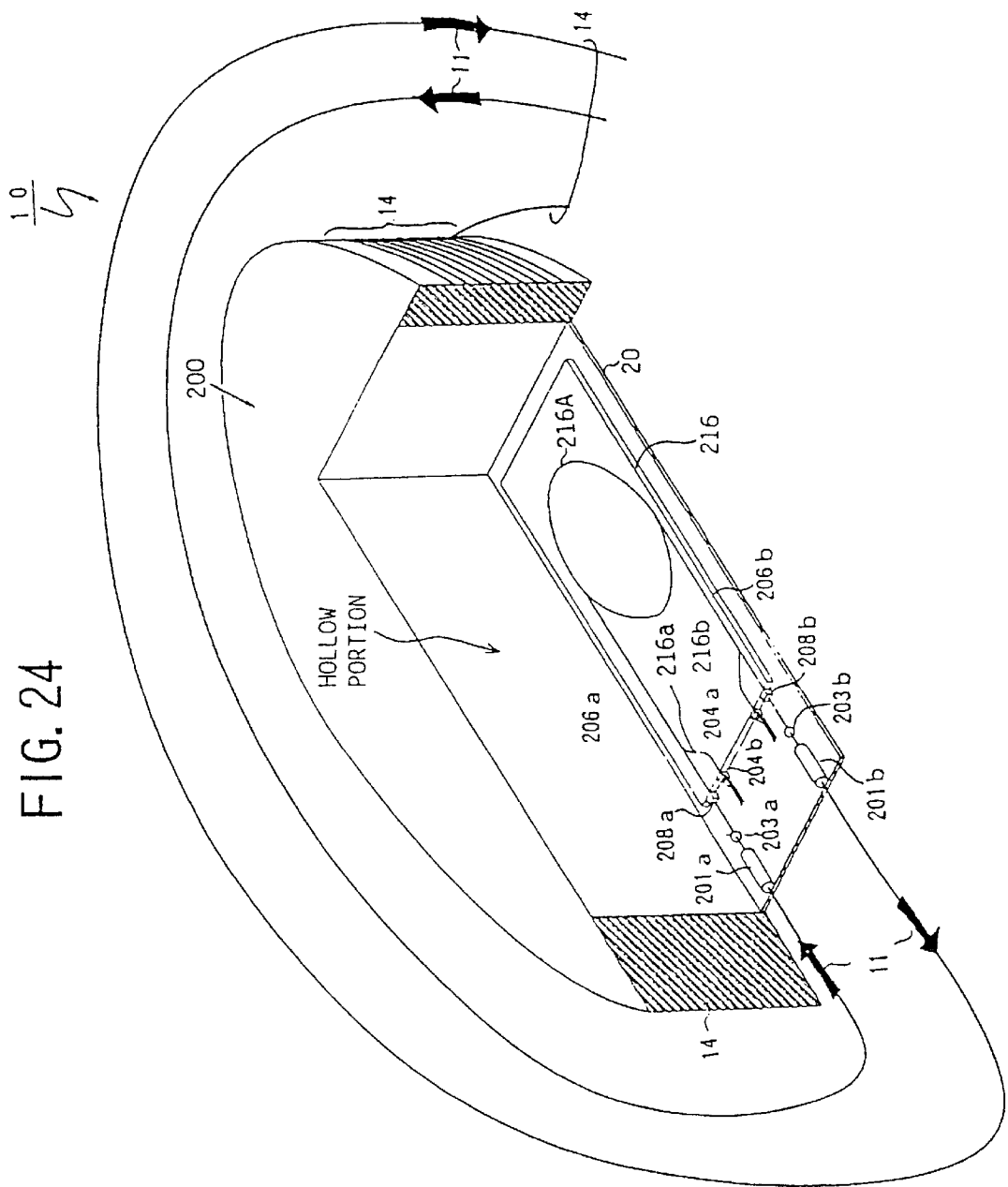
FIG. 24 is a partially cutoff perspective view of the light amplifier device according to the sixteenth embodiment of the present invention.
Figure 25:
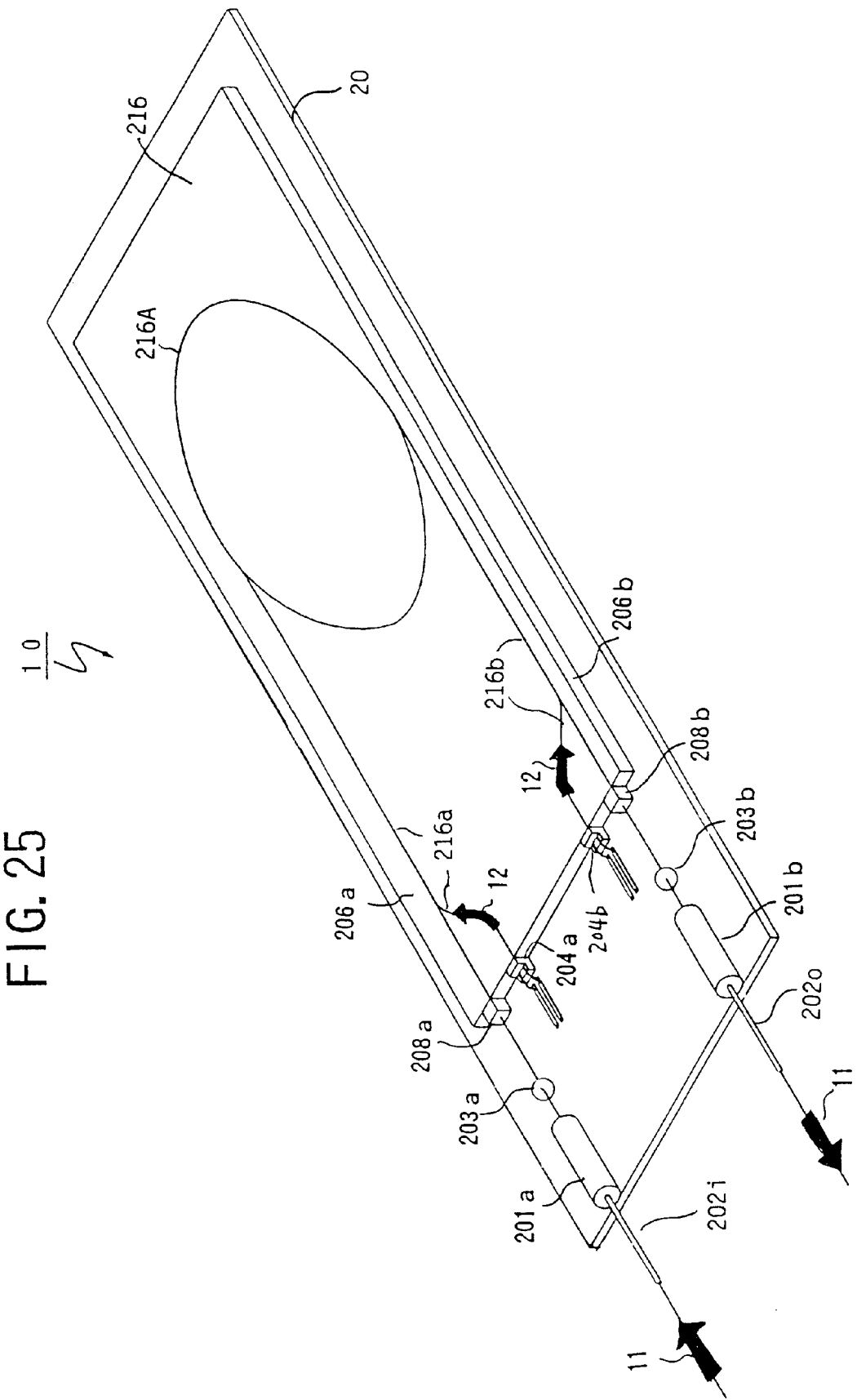
FIG. 25 is a perspective view of the light amplifier device according to the sixteenth embodiment of the present invention.
Figure 26:
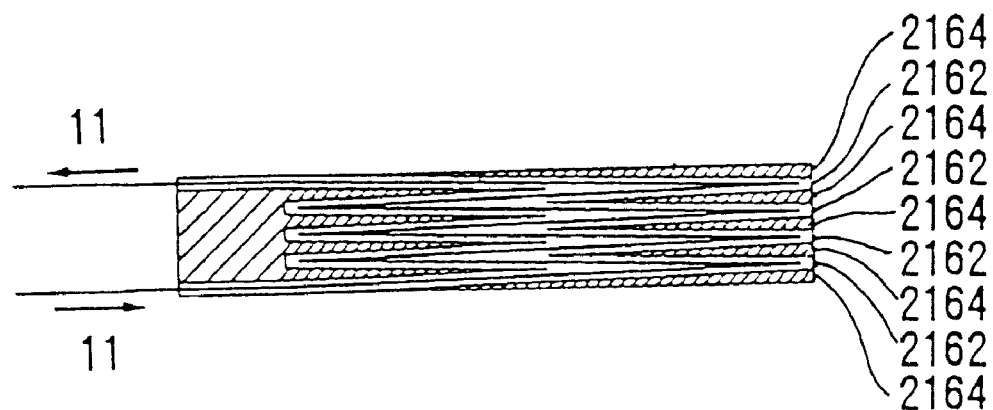
FIG. 26 is a cross-sectional view of a silica-based optical amplifier device used in the sixteenth embodiment of the present invention.

FIGS. 23, 24, 25 and 26 show a sixteenth embodiment of the present invention, in which parts that are the same as those shown in FIG. 19 are given the same reference numbers. As shown in FIGS. 23 and 24, the light amplifier device 10 has a module case 200 similar to the aforementioned module body 20. The module case 200 has a cylindrical shape having a hollow portion. The module body 20 is accommodated in the hollow portion of the module case 200. The distribution compensating type optical fibers 14 optically coupled to the optical isolators 208a and 208b, respectively, are wound around the circumferential surface of the module case 200. The light amplifier device 10 thus configured is a module as a whole. As shown in FIG. 26, the silica-based optical wavelength member 216 has the optical path 216A having the light amplifying function and has a spiral formation which is almost the same as shown in FIG. 17B. It will be noted that the silica-based optical wavelength member 216 used in the twelfth to sixteenth embodiments of the present invention has the optical paths 216a and 216b in addition to the optical path 216A having the light amplifying function. In this regard, the silica-based optical wavelength member 216 shown in FIG. 25 differs from that shown in FIGS. 17A and 17B.

Table 1 shows the size of the conventional light amplifier device and the present invention light amplifier device. More particularly, the present invention light amplifier devices satisfies the aforementioned requirement that the radium of curvature of the optical fiber be equal to or greater than 30 mm.

TABLE 1

|  | module dimensions (cm) | module area (cm$_2$) | module volume (cm$_3$) |
| --- | --- | --- | --- |
| prior art | 20.5 × 14.5 × 2.5 | 297.25 | 743.13 |
| invention | φ6 × 0.8 | 28.27 | 22.62 |

It can seen from the above that the present invention light amplifying device module has an area which is as small as 1/10 of the module area of the conventional device and has a volume which is as small as 1/33 of the module volume of the conventional device. It should be noted that the requirement regarding the radius of curvature of optical fibers can be automatically satisfied and there is no necessity to pay attention to the requirement when assembling the module of the present invention. This provides various advantages as have been described previously.

The present invention is not limited to the specifically disclosed embodiments, and variations and modifications may be made without departing from the scope of the present invention.

What is claimed is:

1. A light amplifier device comprising:
    a module body including a cylindrically shaped portion and a hollow portion;
    an optical fiber amplifying light and winding around the cylindrically shaped portion;
    an exciting light source accommodated in the hollow portion of said module body;
    an optical multiplexer accommodated in the hollow portion of said module body; and
    an optical isolator accommodated in the hollow portion of said module body.

2. The light amplifier device as claimed in claim 1, further comprising:
    a photodiode attached to the module body;
    wherein said exciting light source generates a light, and the photodiode monitors said light in the light amplifier device.

3. The light amplifier device as claimed in claim 1, further comprising:
   a filter attached to the module body;
   wherein said exciting light source generates a light component having a given wavelength, and the filter allows said light component to pass therethrough.

4. The light amplifier device as claimed in claim 1, further comprising a control circuit having a circuit board to control the exciting light source, the circuit board being attached to the module body.

5. The light amplifier device as claimed in claim 1, further comprising a distribution compensating optical fiber via in which an incoming signal light to be amplified by the light amplifier device or an amplified signal light to be output from the light amplifier device is transferred, said distribution compensating optical fiber being wound around the module body.

6. The light amplifier device as claimed in claim 1, further comprising:
   a hollow portion formed in the module body; and a board on which the exciting light source, the optical multiplexer and the optical isolator are mounted, said board being accommodated in said hollow portion of the module body.

7. The light amplifier device as claimed in claim 1, wherein:
   the module body has a cylindrically shaped portion around which the optical fiber having the light amplifying function is wound and a hollow portion; and
   the light amplifier device further comprises a board on which the exciting light source, the optical multiplexer and the optical isolator are mounted, said board being accommodated in said hollow portion of the module body.

8. A light amplifier device comprising:
   a module body;
   an exciting light source attached to said module body;
   an optical multiplexer attached to said module body;
   an optical isolator attached to said module body; and
   a silica-based optical waveguide member having a light amplifying function and mounted on the module body.

9. The light amplifier device as claimed in claim 8, further comprising:
   a photodiode attached to the module body;
   wherein said exciting light source generates a light, and the photodiode monitors said light in the light amplifier device.

10. The light amplifier device as claimed in claim 8, further comprising:
    a filter attached to the module body;
    wherein said exciting light source generates a light component having a given wavelength, and the filter allows said light component to pass therethrough.

11. The light amplifier device as claimed in claim 8, further comprising a control circuit having a circuit board to control the exciting light source, the circuit board being attached to the module body.

12. The light amplifier device as claimed in claim 8, further comprising a distribution compensating optical fiber via in which an incoming signal light to be amplified by the light amplifier device or an amplified signal light to be output from the light amplifier device is transferred, said distribution compensating optical fiber being wound around the module body.

13. The light amplifier device as claimed in claim 8, wherein the silica-based optical waveguide member has an optical path which has the light amplifying function and a spiral formation.

14. A light amplifier device comprising:
    a module body;
    a silica-based optical waveguide member which has a light amplifying function and an optical multiplexer and is mounted on the module body;
    an optical isolator directly attached to the silica-based optical waveguide member; and
    an exciting light source directly attached to the silica-based optical waveguide member.

15. The light amplifier device as claimed in claim 14, further comprising:
    a light generated by said exciting light source; and
    a photodiode to monitor said light in the light amplifier device, the photodiode being attached to the silica-based optical waveguide member.

16. The light amplifier device as claimed in claim 14, further comprising:
    a light generated by said exciting light source; and
    a filter to allow said light having a given wavelength to pass therethrough, the filter being attached to the silica based optical waveguide member.

17. The light amplifier device as claimed in claim 14, further comprising a control circuit having a circuit board and controlling to control the exciting light source, the circuit board being attached to the silica-based optical waveguide member.

18. The light amplifier device as claimed in claim 14, further comprising a distribution compensating optical fiber via in which an incoming signal light to be amplified by the light amplifier device or an amplified signal light to be output from the light amplifier device is transferred, said distribution compensating optical fiber being wound around the module body.

19. The light amplifier device as claimed in claim 14, wherein the silica-based optical waveguide member has an optical path which has the light amplifying function and a spiral formation.

20. A light amplifying device comprising:
    a body including a cylindrically shaped portion and a hollow portion; and
    an optical member amplifying light and winding around the cylindrically shaped portion.

* * * * *

UNITED STATES PATENT AND TRADEMARK OFFICE
CERTIFICATE OF CORRECTION

PATENT NO. : 6,215,582 B1
DATED : April 10, 2001
INVENTOR(S) : Satoshi Sudo et al.

It is certified that error appears in the above-identified patent and that said Letters Patent is hereby corrected as shown below:

<u>Column 12,</u>
Line 37, delete "and controlling".

Signed and Sealed this

Twenty-third Day of October, 2001

Attest:

*Nicholas P. Godici*

NICHOLAS P. GODICI
*Attesting Officer    Acting Director of the United States Patent and Trademark Office*